(12) United States Patent
Schmit et al.

(10) Patent No.: US 9,165,931 B1
(45) Date of Patent: Oct. 20, 2015

(54) APPARATUS FOR FIELD-PROGRAMMABLE GATE ARRAY WITH CONFIGURABLE ARCHITECTURE AND ASSOCIATED METHODS

(71) Applicants: Herman Schmit, Palo Alto, CA (US); David Lewis, Toronto (CA); Michael D. Hutton, Mountain View, CA (US); Dana How, Palo Alto, CA (US); Andy L. Lee, San Jose, CA (US)

(72) Inventors: Herman Schmit, Palo Alto, CA (US); David Lewis, Toronto (CA); Michael D. Hutton, Mountain View, CA (US); Dana How, Palo Alto, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 65 days.

(21) Appl. No.: 14/187,185

(22) Filed: Feb. 21, 2014

(51) Int. Cl.
*H01L 27/115* (2006.01)
*G06F 17/50* (2006.01)
*H01L 27/105* (2006.01)

(52) U.S. Cl.
CPC .......... *H01L 27/105* (2013.01); *G06F 17/5054* (2013.01); *H01L 27/115* (2013.01)

(58) Field of Classification Search
CPC .......................... H01L 27/115; G06F 17/5054
See application file for complete search history.

(56) References Cited

U.S. PATENT DOCUMENTS

| | | | | |
|---|---|---|---|---|
| 7,667,246 | B2 * | 2/2010 | Kim | 257/209 |
| 7,673,273 | B2 * | 3/2010 | Madurawe et al. | 716/138 |
| RE45,110 | E * | 9/2014 | Madurawe et al. | 716/138 |
| 2006/0271901 | A1 * | 11/2006 | Savage et al. | 716/16 |

* cited by examiner

*Primary Examiner* — Evan Pert
(74) *Attorney, Agent, or Firm* — Law Offices of Maximilian R. Peterson

(57) ABSTRACT

An integrated circuit (IC) includes a substrate that is common to the IC and variants of the IC. The IC also includes a first set of interconnect layers fabricated above the substrate. The first set of interconnect layers is used to couple programmable interconnect of the IC to a first circuit in the substrate. The IC further includes a second set of interconnect layers fabricated above the substrate. The second set of interconnect layers is used to differentiate features of the IC from variants of the IC by selectively coupling the programmable interconnect to a second circuit in the substrate.

20 Claims, 15 Drawing Sheets

APPARATUS FOR FIELD-PROGRAMMABLE GATE ARRAY WITH CONFIGURABLE ARCHITECTURE AND ASSOCIATED METHODS

TECHNICAL FIELD

The disclosure relates generally to integrated circuit (IC) architectures and, more particularly, to apparatus for ICs (such as field-programmable gate arrays (FPGAs)) with configurable architecture and associated methods.

BACKGROUND

A variety of technologies have been developed to provide varying degrees of customization or configuration of ICs to end users. For example, one class of IC, the application specific IC (ASIC), typically provides little or no customization. Put another way, an ASIC is typically customized at the design and fabrication stage for a particular end-use. As another example, FPGAs are ICs that are designed and manufactured in order to allow an end-user to program or configure the devices after fabrication or manufacturing has concluded. As a result, FPGAs provide relatively high levels of flexibility to end-users. The increase in flexibility typically results in larger die and higher cost than an ASIC geared towards a particular end-use.

Structured ASICs occupy an intermediate space between ASICs and FPGAs in term of flexibility and customization. Instead of providing programmability of resources, such as logic circuits and interconnect, like FPGAs do, structured ASICs typically use different sets of masks for fabrication of each design. For example, some logic circuitry, such as lookup tables (LUTs) are "hardened" (generally no longer programmable) during the fabrication of a structured ASIC by mapping the circuit into an arrangement of standard cells. The hardening occurs during fabrication of the devices, rather than when used by end-users, and results in changes in the circuitry integrated or fabricated in the substrate of the structured ASIC.

SUMMARY

Apparatus and methods for producing architectural variations of ICs are disclosed. In one exemplary embodiment, an integrated circuit (IC) includes a substrate that is common to the IC and variants of the IC. The IC also includes a first set of interconnect layers fabricated above the substrate. The first set of interconnect layers is used to couple programmable interconnect of the IC to a first circuit in the substrate. The IC further includes a second set of interconnect layers fabricated above the substrate. The second set of interconnect layers is used to differentiate features of the IC from variants of the IC by selectively coupling the programmable interconnect to a second circuit in the substrate.

According to another exemplary embodiment, an FPGA has a substrate that includes FPGA fabric to implement a user's design. The FPGA fabric includes programmable resources for providing a set of features. The FPGA includes a first set of metal layers to couple to one another circuitry in the substrate of the FPGA. The FPGA further includes a second set of metal layers to modify the set of features by unpowering and/or bypassing a resource corresponding to a feature in the set of features.

According to another exemplary embodiment, a method of fabricating FPGAs includes fabricating a first substrate to produce a first FPGA, and fabricating a second substrate to produce a second FPGA. The first and second substrates include the same circuitry. The method further includes fabricating a first set of interconnect layers above the first substrate to interconnect circuitry in the first substrate, and fabricating a second set of interconnect layers above the second substrate to interconnect circuitry in the second substrate. The first and second sets of interconnect layers have the same topology. The method also includes fabricating a third set of interconnect layers above the first substrate to configure features of the first FPGA, and fabricating a fourth set of interconnect layers above the second substrate to configure features of the second FPGA, where the third and fourth sets of interconnect layers having different topologies.

BRIEF DESCRIPTION OF THE DRAWINGS

The appended drawings illustrate exemplary embodiments and therefore should not be considered as limiting the scope of the application or the claims. Persons of ordinary skill in the art appreciate that the disclosed concepts lend themselves to other effective embodiments. In the drawings, the same numeral designators used in more than one drawing denote the same, similar, or equivalent functionality, components, or blocks.

DETAILED DESCRIPTION

Figure 1:
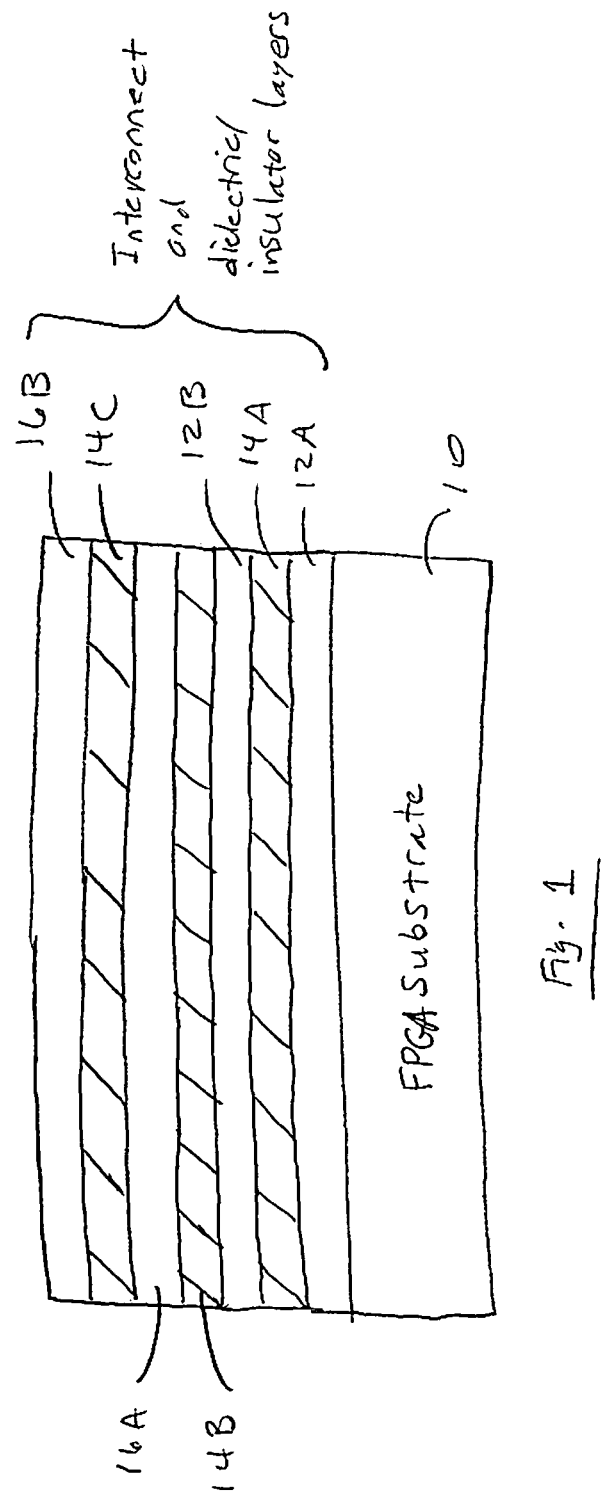
FIG. 1 illustrates lower-level and higher-level metal or interconnect layers for an FPGA according to an exemplary embodiment.

The disclosed concepts relate generally to ICs and, more particularly, to FPGAs with configurable architecture, and associated methods. The disclosed techniques allow creation of different architectural variations of an FPGA by configuring or fabricating (or customizing or modifying or optimizing or changing) a limited or relatively small number (compared to the total number of interconnect layers, such as metal layers, in the IC) of interconnect layers, such as metal and/or via layers. By configuring mask layers for each desired FPGA variant, different FPGA architectures may be fabricated.

This technique enables the production of FPGA variants that are optimized or made more suitable for particular markets or customers, with reduced fabrication costs. The changes to the FPGA architecture occur in the interconnect structure and circuitry, e.g., metal layers, vias, polysilicon interconnects, etc. The substrate and devices fabricated within or on it do not change.

In other words, the programmable features of the FPGA, for example, as realized by the FPGA fabric (programmable logic, programmable interconnect, etc.) remain available in the FPGA variants. One or more interconnect layers, however, may be configured to produce variants of the FPGA that are suited to particular market segments, applications, customer designs, specifications, cost targets or budgets, standards, etc., as desired. In this manner, FPGAs according to exemplary embodiments provide an advantage over structured ASICs, whose architectures are typically hardened to suit a particular application, and do not retain the programmability of the FPGA fabric.

An FPGA is typically designed to have maximum flexibility, and therefore compromises on performance and power consumption. To address this performance or power compromise, frequently used functions can be hardened. In other words, those functions are directly implemented in silicon, as opposed to being implemented as a network of configurable logic and routing resources. An example of hardening may be the implementation of the physical coding sublayer (PCS) layers, which are typically the first digital layers to interact with high speed serial transceivers. These layers are typically implemented using standard cells and automated place-and-route techniques.

Although hardening is a frequently employed technique for FPGAs, it has not been used to change the programmable characteristics of an FPGA architecture. By its nature, an FPGA is designed to support a relatively diverse set of end-user designs. As a result, the FPGA architecture may, often frequently, include features that are unused by particular customer designs or market segments.

For example, wireline systems may have relatively little use for most of the arithmetic features that a typical FPGA may provide. FPGA manufacturers usually do not produce a wireline variant of their products that eliminates unused circuitry, e.g., the digital signal processing (DSP) and arithmetic circuitry like carry-chain, because the investment to produce and support two products tends to be prohibitive. The disclosed concepts provide techniques for producing FPGA architecture variants that minimize or reduce the costs, thus allowing features to be provided for particular market segments that would benefit from those features.

FPGAs according to exemplary embodiments include a substrate (including layers for desired devices, such as transistors, resistors, and the like), and a set of lower-interconnect layers fabricated above the substrate. The combination of the substrate and lower-level interconnect layers are designed to be combined with two or more higher-level interconnect layers to produce programmable variation of the FPGAs' architectures.

FIG. 1 illustrates lower-level and higher-level metal or interconnect layers for an FPGA according to an exemplary embodiment. The FPGA in FIG. 1 includes a substrate 10. Above substrate 10, a set of lower-level interconnect layers are fabricated. The embodiments in FIG. 1 includes two such layers, 12A and 12B, separated by a dielectric (e.g., silicon dioxide) layer 14A.

Lower-level interconnect layers 12A and 12B (layers in closer proximity to substrate 10 than layers 16A-16B) may be used to couple together various devices or circuits (not shown explicitly) in substrate 10. For example, lower-level interconnect layers 12A and 12B may be used to couple together active devices (transistors, diodes, etc.) and passive devices (resistors, capacitors, and/or inductors).

By using lower-level interconnect layers 12A and 12B, basic features of the architecture of the FPGA may be defined. Those features stay the same among the various architectures that may be produced by using a set of higher-level interconnect layers (layers farther from substrate 10 than layers 12A-12B), shown as layers 16A and 16B, separated by dielectric layer 14C. Layers 16A and 16B are separated from layer 12B by dielectric layer 14B. In other words, the lower-level interconnect layers 12A-12B have the same topology or interconnect characteristics among the FPGA variants (that also use the same substrate, as described above).

Note that the exemplary embodiment in FIG. 1 includes a set of two lower-level interconnect layers and a set of two higher-level interconnect layers. In other embodiments, other numbers of lower-level interconnect layers and higher-level interconnect layers may be used, as desired. The choice of the number of interconnect layers depends on factors such as the design complexity for the target FPGA architectures, the available technology, and the like.

Furthermore, note that various interconnects (not shown in FIG. 1), such as vias, may be used to couple together layers 12A-12B, layers 16A-16B, and/or provide interconnect mechanisms between layers 12A-12B and layers 16A-16B. Such interconnects may extend through dielectric layers 14A, 14B, and/or 14C, as appropriate, to provide the desired interconnections between two or more layers.

The higher-level metal or interconnect layers may be configured or used according to various mask sets to differentiate the programmable features or characteristics of the resulting FPGA architectures that may be produced. In this manner, by virtue of maintaining the desired features and programmability of the FPGAs (e.g., the FPGA fabric in substrate 10), architectural variations suitable for various market segments, customers, cost categories or goals, specifications, standards, end-user designs, etc. (FPGA variants), may be fabricated and made available. Thus, unlike lower-level interconnect layers 12A-12B, higher-level 16A-16B have different topology or interconnect characteristics among the FPGA variants.

Figure 2:
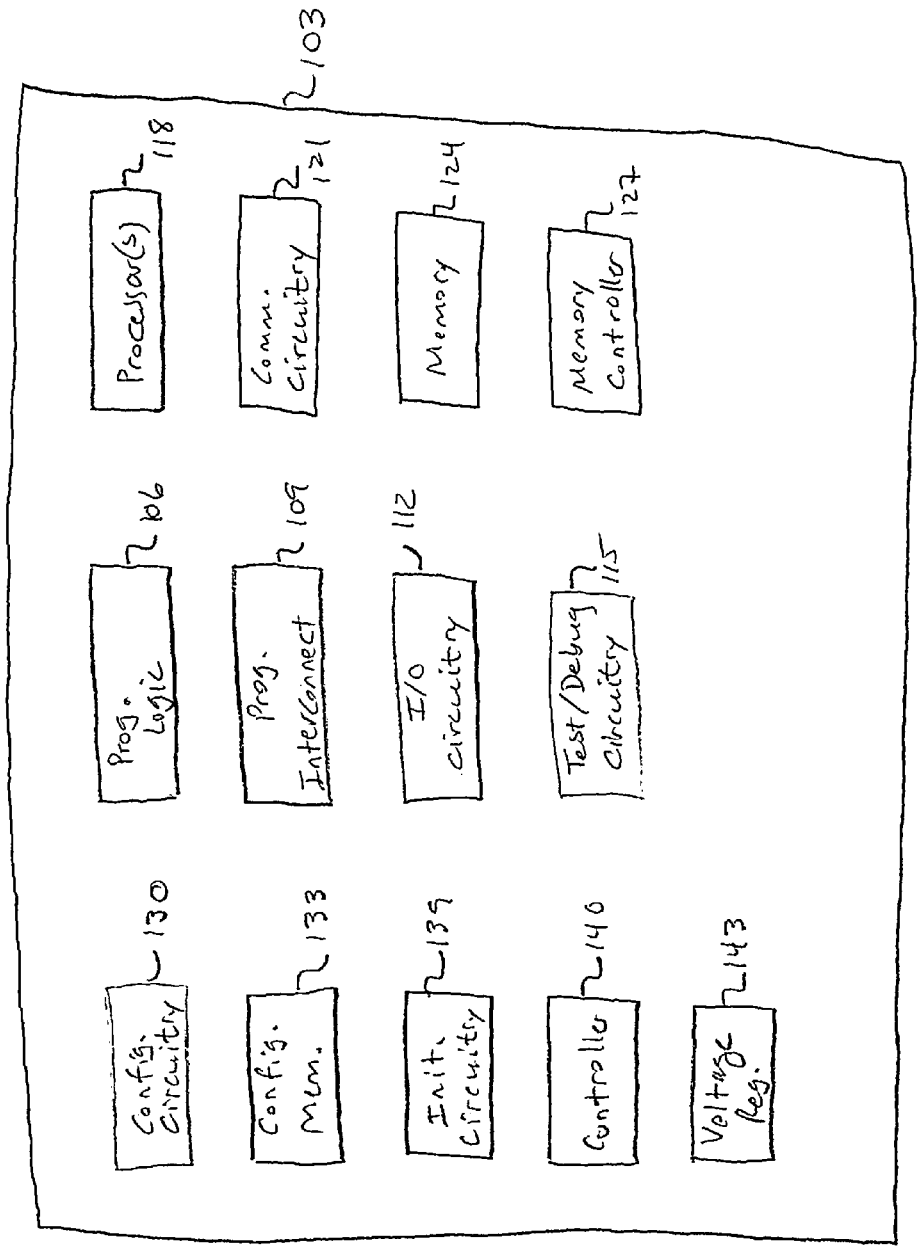
FIG. 2 depicts a block diagram of an FPGA, where variants of the FPGA architecture may be produced according to exemplary embodiments.

The techniques disclosed may be applied to a variety of FPGAs to produce architectural variations. FIG. 2 depicts a block diagram of an example FPGA 103. As noted, variants of the architecture of FPGA 103 may be fabricated or produced according to exemplary embodiments by using the disclosed techniques. For example, by using metal layer configuration, as described above, architectural variations of FPGA 103 may be produced. As another example, various blocks of circuitry in FPGA 103 may be unpowered or powered down or bypassed or disconnected (or not connected or coupled) to produce architectural variations of FPGA 103. Other techniques described in this document may also be applied to FPGA 103 to produce architectural variations of it.

Referring to the example shown in FIG. 2, FPGA 103 includes configuration circuitry 130, configuration memory (or configuration random access memory, CRAM) 133, controller 140, programmable logic 106, programmable interconnect 109, and I/O circuitry 112. In addition, FPGA 103 may include test/debug circuitry 115, one or more processors 118, one or more communication circuitry 121, one or more memories 124, one or more controllers 127, and initialization circuitry 139, as desired.

In some embodiments, FPGA 103 may also include one or more voltage regulators or power supply circuits 143. Voltage regulator(s) 143 receive one or more external sources of power (not shown), and provide one or more output voltages to power various circuitry in FPGA 103. Note that rather than, or in addition to, using voltage regulators, current regulators may be used, as desired.

Programmable logic 106 includes blocks of configurable or programmable logic circuitry, such as LUTs, product-term logic, pass gates, multiplexers (MUXs), logic gates, registers, memory, and the like (sometimes known as the programmable fabric, or simply fabric, of the FPGA). As described below in detail, metal layer configuration may be used to power down, unpower, disconnect, and/or bypass circuitry in programmable logic 106 to produce architectural variations of FPGA 103.

Programmable interconnect 109 couples to programmable logic 106 and provides configurable interconnects (coupling mechanisms) between various blocks within programmable logic 106 and other circuitry within or outside FPGA 103 (for example, by using pass gates, transmission gates, and/or MUXs). In some embodiments, programmable logic 106 and/or programmable interconnect 109 may include fuses and/or anti-fuses to provide additional flexibility or programmability. As described below in detail, metal layer configuration may be used to power down, unpower, disconnect, and/or bypass circuitry in programmable interconnect 109 to produce architectural variations of FPGA 103.

Initialization circuitry 139 may cause the performance of various functions at reset or power-up of FPGA 103. At or after power-up, FPGA 103 obtains configuration information, typically from an external device. Based on the configuration information, various blocks or devices within the FPGA core or fabric, or other blocks or resources in FPGA 103, are configured or programmed. Examples include programmable logic 106 and programmable interconnect 109.

CRAM 133 operates with initialization circuitry 139 to provide the programmable features of FPGA 103. More specifically, bits in the configuration information typically program the contents of CRAM 133. The contents of CRAM 133 in turn program various features and functions of FPGA 103, for example, the functions realized or implemented by programmable logic 106 and the interconnect topology (e.g., how the various circuits or blocks in the FPGA fabric are coupled to one another) realized or implemented by programmable logic 109.

I/O circuitry 112 may constitute a wide variety of I/O devices or circuits. I/O circuitry 112 may couple to various parts of FPGA 103, for example, programmable logic 106 and programmable interconnect 109. I/O circuitry 112 provides a mechanism and circuitry for various blocks within FPGA 103 to communicate with external circuitry or devices. Metal layer configuration may be used to power down, unpower, disconnect, and/or bypass various circuits or blocks in I/O circuitry 112 to produce architectural variations of FPGA 103.

Test/debug circuitry 115 facilitates the testing and troubleshooting of various blocks and circuits within FPGA 103. Test/debug circuitry 115 may include a variety of blocks or circuits known to persons of ordinary skill in the art. For example, test/debug circuitry 115 may include circuits for performing tests after FPGA 103 powers up or resets, as desired. Test/debug circuitry 115 may also include coding and parity circuits, as desired.

FPGA 103 may include one or more processors 118. Processor 118 may couple to other blocks and circuits within FPGA 103. Processor 118 may receive data and information from circuits within or external to FPGA 103 and process the information in a wide variety of ways, as persons skilled in the art understand. One or more of processor(s) 118 may constitute a digital signal processor (DSP). DSPs allow performing a wide variety of signal processing tasks, such as compression, decompression, audio processing, video processing, filtering, coding, decoding, and the like, as desired. Metal layer configuration may be used to power down, unpower, disconnect, and/or bypass one or more blocks or circuits (or the entire processor, if desired) in processor 118 to produce architectural variations of FPGA 103.

FPGA 103 may also include one or more communication circuit(s) 121. Communication circuit(s) 121 may facilitate data and information exchange between various circuits within FPGA 103 and circuits external to FPGA 103, as persons of ordinary skill in the art understand. Examples of communication circuit 121 include transceivers, network interface circuits, etc. In some embodiments, communication circuit(s) 121 may include circuitry for sending and/or receiving serial data, such as serializers, deserializers, data clock recovery circuits, coders, decoders, pre-emphasis circuits, and/or equalization circuits, as desired. Metal layer configuration may be used to power down, unpower, disconnect, and/or bypass one or more blocks or circuits (or the entire communication circuit, if desired) in communication circuit 121 to produce architectural variations of FPGA 103.

FPGA 103 may further include one or more memories 124 and one or more memory controller(s) 127. Memory 124 allows the storage of various data and information (such as user-data, intermediate results, calculation results, etc.) within FPGA 103. Memory 124 may have a granular or block form, as desired. Memory 124 may include memory circuitry in the form of one or more intellectual property (IP) blocks, as desired. Metal layer configuration may be used to power down, unpower, disconnect, and/or bypass one or more blocks or circuits (or the entire memory, if desired) in memory 124 to produce architectural variations of FPGA 103.

Memory controller 127 allows interfacing to, and controlling the operation and various functions of, circuitry outside the FPGA. For example, memory controller 127 may interface to and control an external synchronous dynamic random access memory (SDRAM).

Controller 140 may control or supervise various functions of FPGA 103. For example, controller 140 may control or program body-bias values for one or more circuits or transistors (e.g., to control power consumption and/or speed of operation). As another example, controller 140 may control low-power functionality of FPGA 103, for example, by controlling clock rates, by shutting down circuitry, and/or using sleep functionality of circuitry, etc. Other control functions are contemplated, depending on the type of circuitry included in an FPGA according to an embodiment, and the type of characteristics or specifications for circuitry within the FPGA.

Note that the figure shows a general block diagram of FPGA 103. Thus, FPGA 103 may include other blocks and circuitry, as persons of ordinary skill in the art understand. Examples of such circuitry include clock generation and distribution circuits, and the like. Furthermore, FPGA 103 may include analog circuitry, other digital circuitry, and/or mixed-signal or mixed-mode circuitry, fuses, anti-fuses, and the like, as desired.

Furthermore, note that the depiction and description of FPGA 103 serves to provide merely one example of an FPGA, architectural variations of which may be produced, and should not limit the scope of the disclosed techniques and appended claims. Generally, the disclosed techniques may be applied to a variety of FPGAs to produce a wide range and/or type of architectural variations, as desired.

In some embodiments, circuitry within FPGA 103, such as the FPGA fabric, may include a hierarchical structure. Metal layer configuration may be used to produce architectural variations of FPGA 103 by changing the topology and functionality of the FPGA fabric, e.g., programmable logic 106 and/or programmable interconnect 109, as described below in detail.

Figure 3:
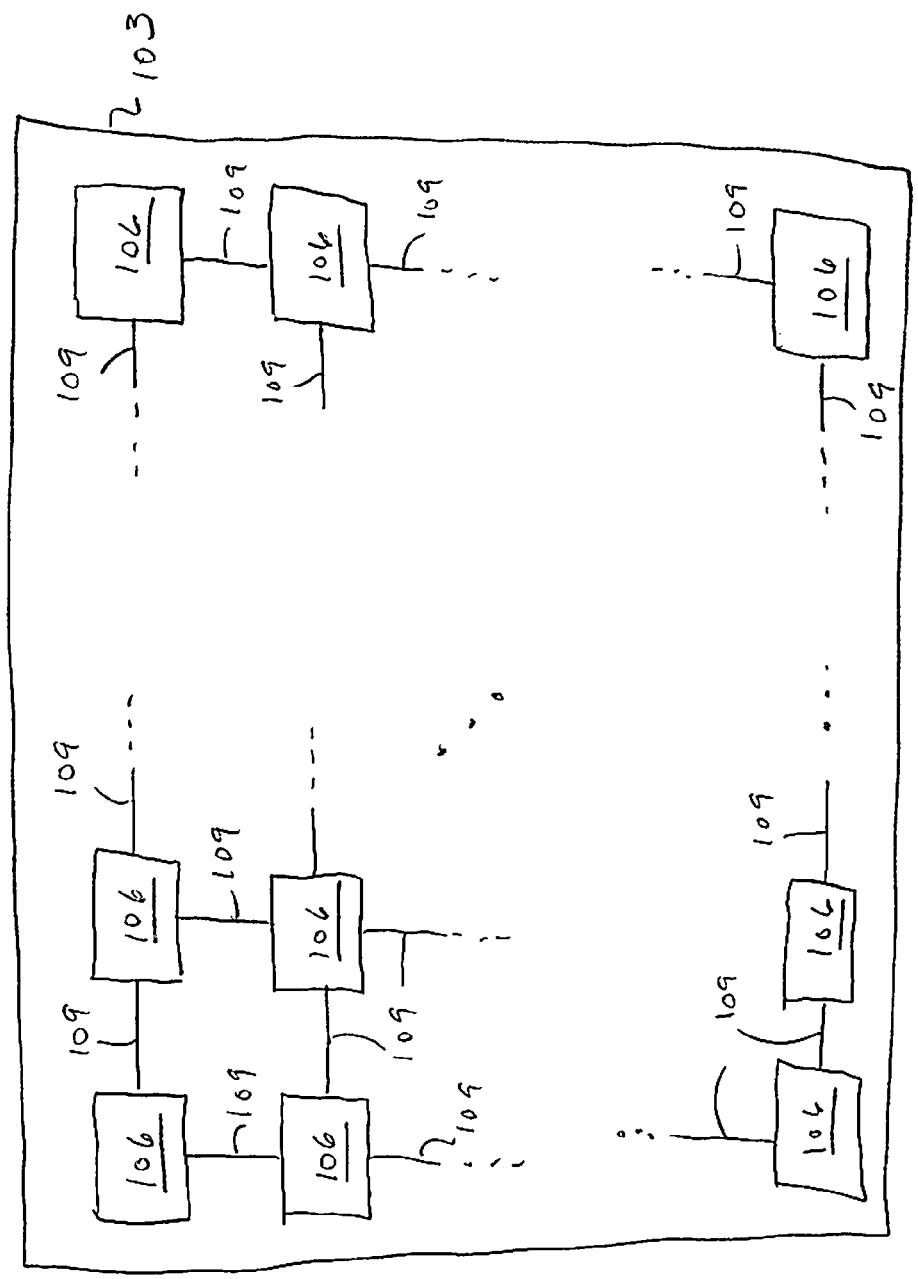
FIG. 3 shows a conceptual block diagram of FPGA resources arranged in a two-dimensional array according to an exemplary embodiment.

In some embodiments, logic circuitry (e.g., programmable logic 106) may be disposed within FPGA 103 as a two-dimensional array. FIG. 3 shows such an array according to an exemplary embodiment. Specifically, FIG. 3 illustrates a conceptual block diagram of programmable logic 106 and programmable interconnect 109 arranged in a two-dimensional array in the floor-plan of FPGA 103. The array includes blocks of programmable logic 106 arranged in rows and columns. In some embodiments, FPGA 103 may include tiles, one or more of which may includes one or more blocks of programmable logic 106.

Programmable interconnect 109, arranged as horizontal interconnect and vertical interconnect, couples the blocks of programmable logic 106 to one another. In some embodiments, one or more segments of programmable interconnect 109 may couple to one another tiles of circuitry (not shown) in FPGA 103. Furthermore, in some embodiments, in addition to programmable logic 106 and programmable interconnect 109, FPGA 103 may include other circuits or blocks of circuits arranged as an array, for example, various blocks or circuits shown in FPGA 103 in FIG. 2.

In some embodiments, the two-dimensional array, such as the array shown in FIG. 2, may include a hierarchical structure. For example, the array may include blocks of configurable logic named logic array blocks (LABs) and/or other programmable or configurable logic circuit. As another example, LABs (or other programmable or configurable logic circuits) may in turn include resource blocks, such as logic elements (LEs), adaptive logic modules (ALMs), and/or other programmable logic circuitry, as desired. In other words, blocks of programmable logic 106 may in turn include smaller or more granular programmable logic blocks or circuits. In some embodiments, the blocks of programmable logic may have other names, such as configurable logic blocks (CLBs), etc. Regardless of the particular terminology used, metal layer configuration may be applied to such blocks to produce architectural variations of the FPGA.

Figure 4:
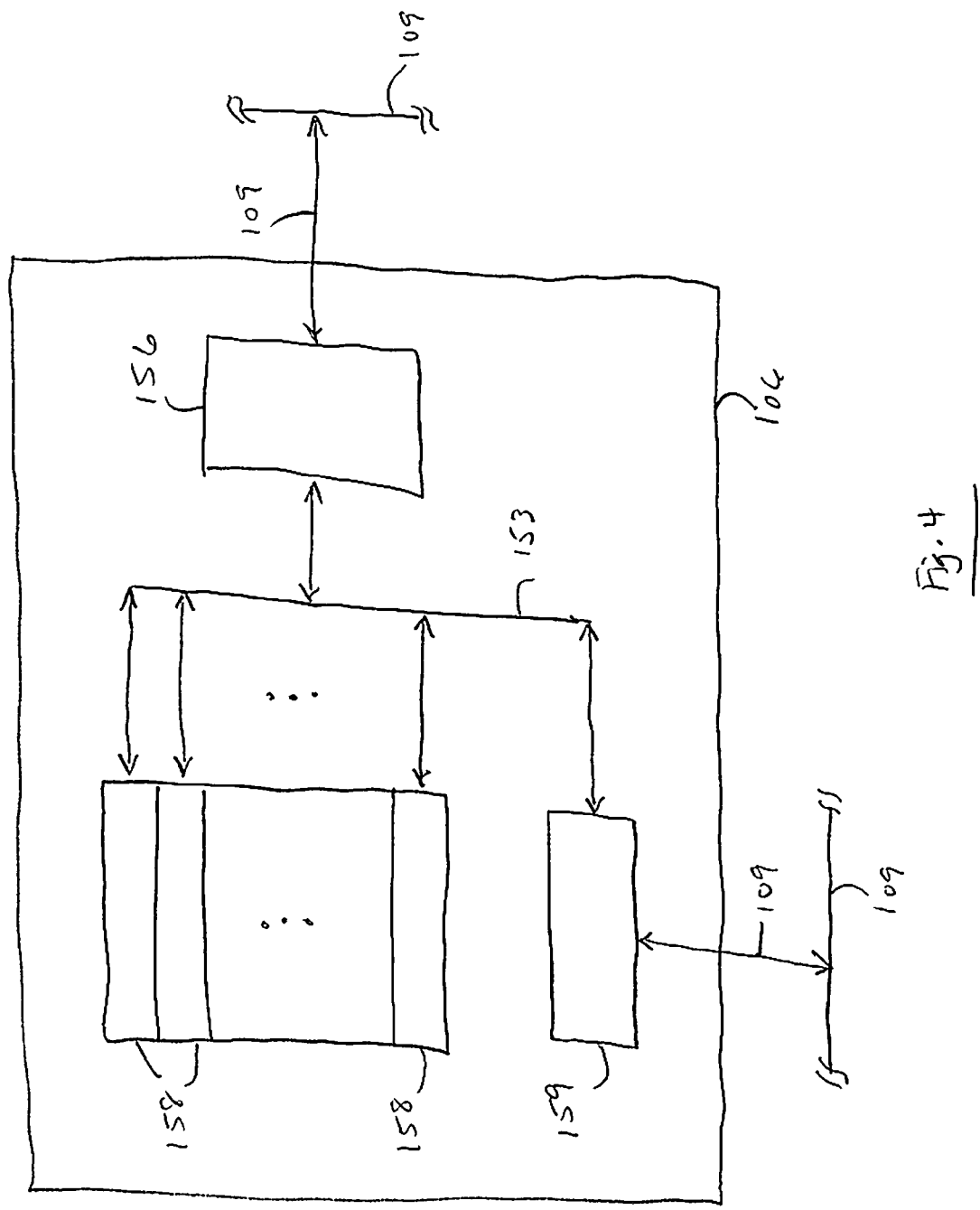
FIG. 4 depicts a conceptual block diagram of additional details of hierarchical programmable logic in a FPGA according to an exemplary embodiment.

FIG. 4 illustrates a block diagram of a resource block used in FPGA 103, which use hierarchical programmable logic 106. In the embodiment shown, a block of programmable logic 106 (e.g., a LAB, without loss of generality) includes LEs, ALMs, CLBs, or generally programmable logic circuits or blocks 158, local interconnect 253, interface circuit 156, and interface circuit 159. To facilitate the discussion, the following description uses the term "LE" or "LEs" to refer to blocks 158 without limitation. Other types of circuitry may be used, however, for example, ALMs, CLBs, or other programmable logic circuits or blocks, as desired, in various embodiments.

LEs 158 provide configurable or programmable logic functions, for example, LUTs, registers, product-term logic, etc., as persons of ordinary skill in the art who have the benefit of the description of the invention understand. As described below, metal layer configuration may be applied to blocks 158 to produce architectural variations of the FPGA.

Local interconnect 153 provides a configurable or programmable mechanism for logic elements 158 to couple to one another or to programmable interconnect 109 (sometimes called "global interconnect"), as desired. Interface circuit 156 and interface circuit 159 provide a configurable or programmable way for programmable logic 106 block of circuitry to couple to programmable interconnect 109 (and hence to other programmable logic 106, as FIG. 3 shows). Interface circuit 156 and interface circuit 159 may include MUXs, registers, buffers, drivers, and the like, as desired. In exemplary embodiments, programmable interconnect 109 may include pass gates, transmission gates, MUXs, switches, drivers, buffers, and the like, as desired.

Programmable logic circuits or blocks 158 (referred to as block or blocks 158 without loss of generality) may have a variety of architectures and may include various types and numbers of circuits, as desired. Regardless of the particular architecture and circuit topology, blocks 158 include programmable logic circuitry that may be used together with programmable interconnect 109 (see, for example, FIGS. 2-3) to implement a user's circuit or design.

One aspect of the disclosure relates to powering down or unpowering (removing or disconnecting power, or not connecting or routing power) and/or bypassing various circuitry in the FPGA. In addition to directly reducing power consumption of those circuits, this technique allows further leakage power reduction because configuration memory cells or regions associated with those circuits may also be unpowered or powered down. In exemplary embodiments, this technique may be applied to the FPGA fabric, such as programmable interconnect and/or programmable logic, for example, blocks 158 (see FIG. 4).

Figure 5:
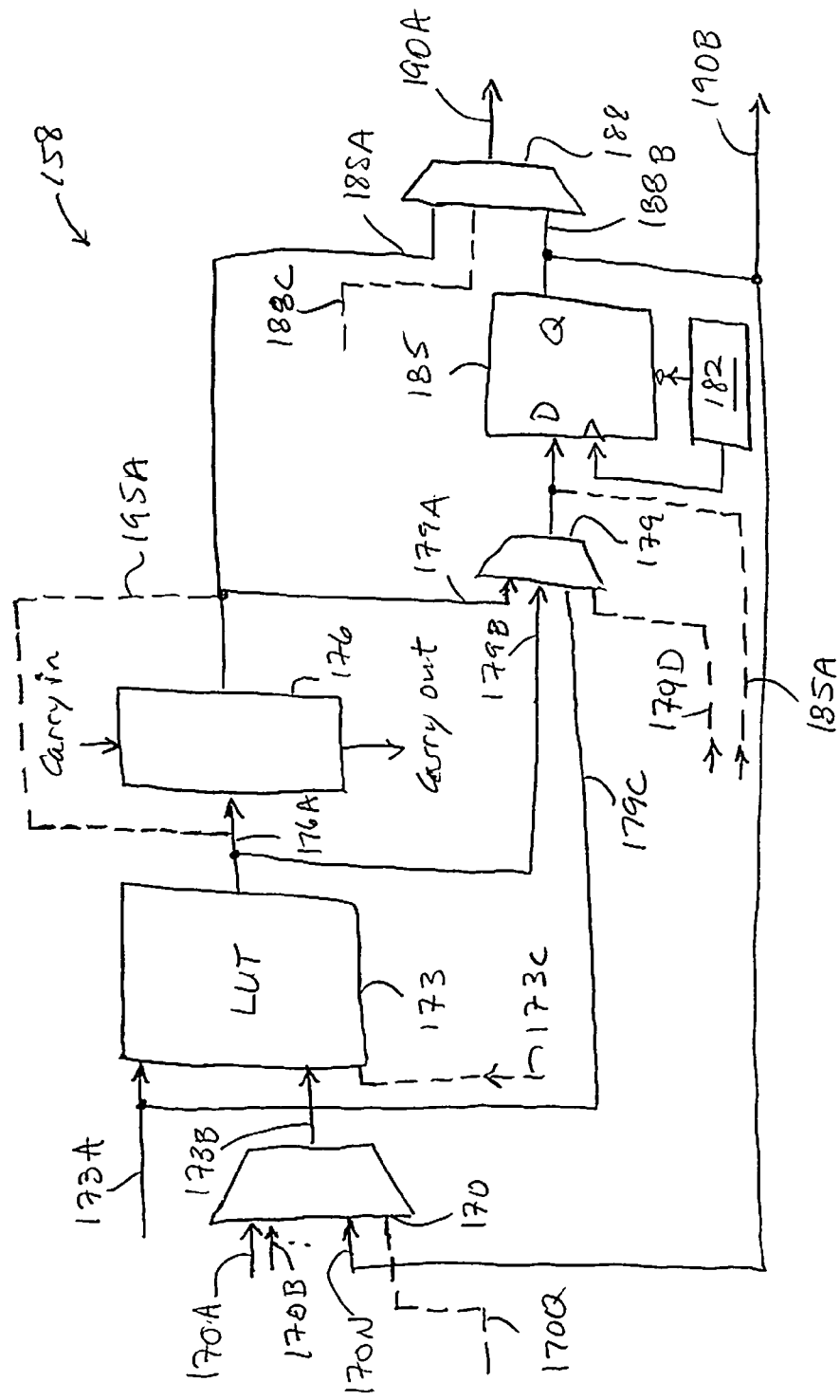
FIG. 5 illustrates a block diagram of a programmable logic circuit or block 158 according to an exemplary embodiment.

FIG. 5 illustrates a block diagram of a block 158 according to an exemplary embodiment. As noted above and described below in detail, one may produce FPGA architecture variants by, at least in part, by changing the connections or coupling mechanisms in blocks 158, by powering down, and/or by bypassing one or more blocks or circuits in block(s) 158.

Referring to FIG. 5, block 158 may constitute, in various embodiments, an LE, an ALM, or another type of block or circuit that includes programmable circuitry. Note that FIG. 5 shows a generalized block diagram of such a block or circuit. Many variations are possible and are contemplated within the scope of this disclosure.

Referring to FIG. 5, block 158 includes input routing circuitry (e.g., MUX 170), one or more LUTs 173, one or arithmetic circuits 176, signal routing circuitry (e.g., MUX 179, one or more flip-flops or registers 185, and output routing circuitry (e.g., MUX 188). Note that, although the description below refers to single blocks or circuits, e.g., LUT 173, more than one of the circuits shown in FIG. 5 may be used in various embodiments, as desired.

MUX 170 receives one or more inputs (e.g., input 170A, 170B, etc., or input 170N, which represents the output of flip-flop 185). MUX 170 selects (in response to select signal (s), not shown) one of the inputs signals, and provides that signal as its out signal. Thus, MUX 170 provides a flexible mechanism for selecting an input from among several input signals for processing by block 158.

Output signal of MUX 170 drives one input of LUT 173. Another input of block 158 drives a second input of LUT 173. LUT 173 provides a mechanism for performing combinatorial logic operations on the input signals. Thus, LUT 173 allows block 158 to perform arbitrary logic functions on its input signals. Note that, in exemplary embodiments, LUT 173 may have more than two inputs, for example, four, five, or six inputs, as desired. Note further that the additional inputs of LUT 173 may be driven by any desired signal, for example, additional input(s) (not shown) of block 158, other signal(s) in block 158, etc., as desired.

The output of LUT 173 drives input 176A of arithmetic circuit 176. An additional input signal (not shown in FIG. 5)

of arithmetic circuit 176 may constitute an input signal of block 158 (e.g., input 173A, or input 170A, or an input not shown in FIG. 5). In addition, arithmetic circuit 176 may optionally receive a carry signal at its "carry in" input.

Arithmetic circuit 176 may perform various arithmetic operations, such as addition or subtraction, on its input signals. Arithmetic circuit 176 provides the results of the arithmetic operation to input 188A of MUX 188. In addition, arithmetic circuit 176 may optionally provide a carry signal at its "carry out" output.

MUX 179 provides a mechanism for selecting a signal from among a number of signal, and providing that signal to input "D" of flip-flop 185. More specifically, MUX 179 selects (in response to select signal(s), not shown) one of the inputs signals, and provides that signal as its output signal to the "D" input of flip-flop 185. Thus, MUX 179 provides a flexible mechanism for selecting an input from among several input signals for processing by flip-flop 185.

In the embodiment shown, MUX 179 receives an input 179A from the output of arithmetic circuit 176, another input, shown as 179B, from the output of LUT 173, and another input, shown as 179C, from input 173A of block 158. Note that the configuration shown in FIG. 5 constitutes merely one example. In other embodiments, other configurations of block 158 generally, and MUX 179 in particular, may be used, as desired.

As noted, the output of MUX 179 drives the "D" input of flip-flop 185. A logic or control circuit 182 drives the clock and clear (if used) inputs of flip-flop 185. In response to input signals (not shown) of block 158, logic circuit 182 provides appropriate clock and clear (if used) signals to flip-flop 185.

Flip-flop 185 provides a mechanism for block 158 to perform sequential logic operations on various signals, such as input signal 173A, the output signal of LUT 173, or the output signal of arithmetic circuit 176. In the embodiment shown, the output "Q" of flip-flop 185 drives one input of MUX 170. This feedback configuration provides block 158 with a relatively flexible mechanism for performing sequential logic operations.

The "Q" output of flip-flop 185 drives input 188B of MUX 188. As noted, the output signal of arithmetic circuit 176 drives another input 188A of MUX 188. MUX 188 selects (in response to select signal(s), not shown) one of the inputs signals, and provides that signal as output signal 190A of block 158. Thus, MUX 188 provides a flexible mechanism for selecting an input from among several input signals to provide as an output of block 158.

In addition to, or instead of, the output signal of MUX 188, other signals might serve as outputs of block 158. For example, the embodiment in FIG. 5 shows the "Q" output of flip-flop 185 as driving output 190B of block 158. Other examples may include the output signal of MUX 179, the output signal of LUT 173, and/or the output signal of arithmetic circuit 176.

As described above, block 158 provides a flexible way of performing logic operations on one or more input signals, and to provide the result(s) as one or more output signals. When used as part of a hierarchical structure of programmable logic, together with programmable interconnect, one may realize powerful and flexible FPGA architectures. By modifying a limited or relatively small number of interconnect layers, such as metal and/or via layers, as noted above, variations of the FPGA architectures may be produced.

The following description provides examples of using the higher-level metal or interconnect layers to differentiate the programmable features or characteristics of the FPGA according to exemplary embodiments. The techniques may be applied to a wide variety of FPGAs, such as to the circuitry shown in FIGS. 1-5, discussed above.

As noted, generally speaking, FPGAs with different overall architectures may be produced or fabricated by using the higher-level metal or interconnect layers, e.g., by changing the number and/or characteristics of the higher-level metal or interconnect layers. In this manner, a multitude of FPGA architecture variants may be produced.

According to one aspect of the disclosure, metal or interconnect variations may be used to power down (or shut down or disable) one or more resources in FPGAs (e.g., circuitry in block 158, shown in FIG. 5) and, thus, produce FPGA architecture variants, as described below. As an example, consider wireline communication FPGA architecture variants that do not use, for example, DSP circuitry of the FPGA (see, for example, DSP circuitry as part of processor(s) 118 in FIG. 2). In this situation, power delivered to the DSP functional blocks could be removed or shut down or disabled, i.e., the blocks would be unpowered or powered down. Consequently, the user would save the static power dissipated by those resources (even if they are unused), and any dynamic power resulting from switching circuits inside the those functional blocks or units.

Such an approach would entail separation of power distribution of unpowered or powered down resources from other resources of a design that would not be unpowered. Specifically, although the DSP circuitry could be unpowered, but routing or interconnect circuitry would be powered separately (so as not to lose interconnect or routing resources used to route over or above the DSP circuitry.

Furthermore, one would likely take into account configuration and testing resources (see, for example, FIG. 2). Those resources might receive power via the same power network as the DSP circuitry. In that situation, one would want to separate the power network for those resources from the power network for the DSP circuitry, as doing so would allow those resources to remain powered even when the DSP circuitry is unpowered.

Moreover, typical FPGAs may include a variety of relatively large fixed-function blocks or circuits. For example, an FPGA may include a hardened (i.e., implemented independently or nearly independently of the programmable resources of the FPGA) PCI Express (PCIe) interface, multi-core processors, and the like. Unpowering those resources would be beneficial if a user's design does not use them. In the case of a multi-core processor, unpowering one or more individual cores not used in implementing the user's design would also offer increased power flexibility and the benefits described above.

As noted above, in exemplary embodiments, one or more circuits or blocks in block 158 (see FIG. 5) may be unpowered to produce FPGA variants. For example, in some embodiments, circuitry unused by the user (or a particular market segment, cost category, etc.) may be unpowered or powered down and/or bypassed by fabricating interconnect layers that achieve that purpose. Mask hardening or specialization, as opposed to programmable switch-based configuration, provides the benefit that capacitive loads can be removed from a net, thus improving performance. The removal of the loads on various nodes would improve the speed of the nets that drive those pins, as well as decrease the power consumption of the circuit or block. The bypass of the structures or circuits near storage devices (registers, flip-flops, etc.) also accelerates the signal travel time to the registers. In the case of masked bypasses, the mask change would decouple the existing driver from the bypassed circuit (not shown explicitly).

As one particular example, in some embodiments, arithmetic circuit 176 may be unused or undesired. Thus, arithmetic circuit 176 may be unpowered or powered down and/or bypassed, for example, by using link or interconnect 195A. One or more interconnect layers, such as metal layers fabricated above the substrate of the FPGA, may be used or configured to remove the provision of power to arithmetic circuit 176, and to remove (disconnect, or short) the coupling of other parts of block 158 to inputs and outputs of arithmetic circuit 176. For example, referring to FIG. 5, signal or net 176A may be routed to MUX 179, but not an input of arithmetic circuit 176 (alternatively, the input of arithmetic circuit 176 (coupled to 176A) may be shorted or coupled to its output, in effect to signal or net 188A, by using link or interconnect 195A). The output of arithmetic circuit 176, i.e., signal or net 179A, may also be uncoupled from MUX 179.

As another example, referring to FIGS. 4-5, block 158 may include a LUT (e.g., LUT 173) of a given size, for example, a 6-input LUT, but a particular application or market may specify 4-input LUTs. In other situations, in some embodiments, block 158 may include more than one LUT, or provide the flexibility to support different sets of LUT sizes. If for a particular application or end use the flexibility is not desired, configuration registers (not shown explicitly) or parts of configuration memory 133 (see FIG. 2) can be bypassed or configured via mask layers to provide the desired LUT functionality or configuration. This technique can also lower capacitive loads, and thus improve speed of operation and lower power consumption.

Referring to FIG. 5, a number of other alternatives may be used to produce FPGA variants. For example, additional inputs may be provided to one or more of MUX 170 (e.g., input 170Q), LUT 173 (e.g., input 173C, similar to 173A, i.e., bypassing MUX 170), MUX 179 (e.g., input 179D), and MUX 188 (e.g., input 188C). As another example, in situations where more than one LUTs 173 and/or arithmetic circuits 176 exist in one or more blocks 158, rather than route the same set of inputs to the LUTs and/or arithmetic circuits, the set of inputs may be divided into sets that feed particular LUT(s) and/or arithmetic circuit(s), by using interconnect layer configuration.

As another example, rather than route data inputs through MUXs (e.g., MUX 170, MUX 179), one or more data signals (e.g., 185A) may be routed to one or more flip-flops 185, thus providing more flexible access to flip-flop(s) 185. As another example, most or all of the circuitry in block(s) 158 may be unpowered and/or bypassed, as desired, by using appropriately configured mask sets for one or more interconnect layers.

In addition, a large number of other variants may produced, for example, by combining one or more of the techniques described above. Regardless of the exact configuration desired, FPGA variants may be produced by using interconnect layer configuration, as described above.

Referring to FIG. 4, interface circuits 156 and 159 are used to couple block(s) 158 to programmable interconnect 109. Interface circuits 156 and 159 may include a variety of circuitry, as noted, above, such as MUXs. One aspect of the disclosure relates to powering down or unpowering and/or bypassing such MUXs, as FIGS. 6-9 illustrate.

Figure 6:
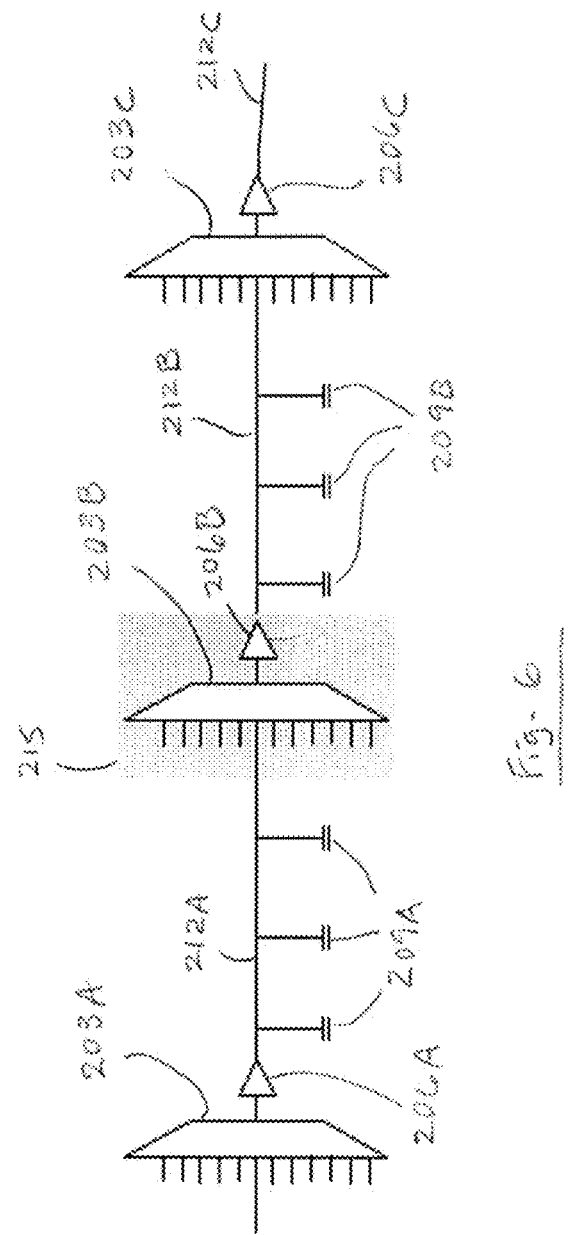
FIGS. 6-9 show circuit arrangement for producing FPGA variants by configuring interconnect layers according to exemplary embodiments.

FIG. 6 shows a circuit arrangement for routing signals according to an exemplary embodiment. The circuits in FIG. 6 may be used in interface circuits 156 and 159 and/or in programmable interconnect 109. MUXs 203A-203C represent MUXs that may be used, for example, in interface circuits 156 and/or 159 (see FIG. 4). Referring to FIG. 6, MUXs 203A-203C are part of programmable logic circuitry of the FPGA, in this particular case, programmable circuitry that is (or is desired to be) unpowered or powered down at least partially via interconnect configuration. MUXs 203A-203C drive buffers 206A-206C, which in turn drive interconnect segments 212A-212C, respectively. Capacitive loads 209A-209B represent the capacitance of interconnect segments 212A-212B, respectively.

In the circuit arrangement of FIG. 6, highlighted area 215 represents active or powered circuitry, i.e., MUX 203B and buffer 206B retain power. Thus, MUX 203B and buffer 206B provide full routing capability from one or more inputs of MUX 203B to interconnect segment 206B and any circuits coupled to it. This configuration allows selective routing capability while also providing for unpowering or powering down part of programmable logic of the FPGA (e.g., one or more blocks 158 or other circuitry in FIG. 4).

Figure 7:
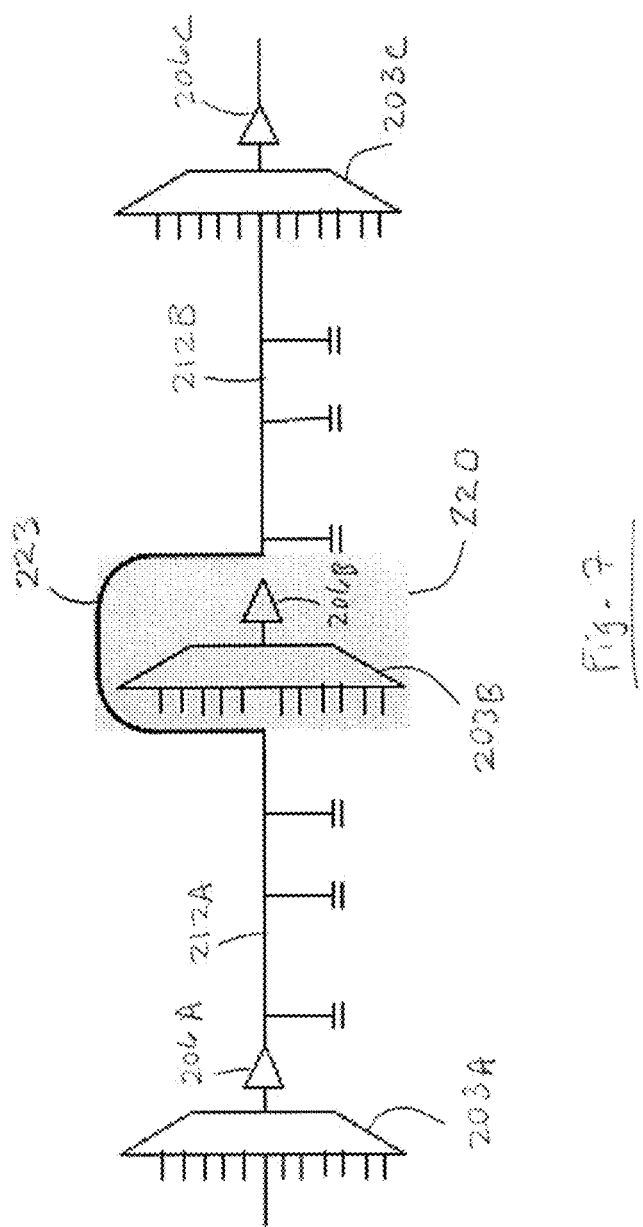

FIG. 7 shows another circuit arrangement for routing signals according to an exemplary embodiment. In this embodiment, highlighted area 220 denotes circuitry that is unpowered or powered down, i.e., MUX 203B and buffer 206B. To provide routing capability for the rest of the circuit (and/or for other circuitry in the FPGA), MUX 203B and buffer 206B may be bypassed, for example, by using interconnect or coupling mechanism or link 223 (e.g., a metal trace). Thus, link 223 provides a routing mechanism for signals present on interconnect segment 212A to reach and couple to interconnect segment 212B. This arrangement can reduce power consumption, because configuration memory cells related to the bypassed circuits need be powered. Coupling interconnect segment 212A to interconnect segment 212B, however, can effectively couple the capacitive loads in parallel, and thus may slow down signal transitions.

Figure 8:
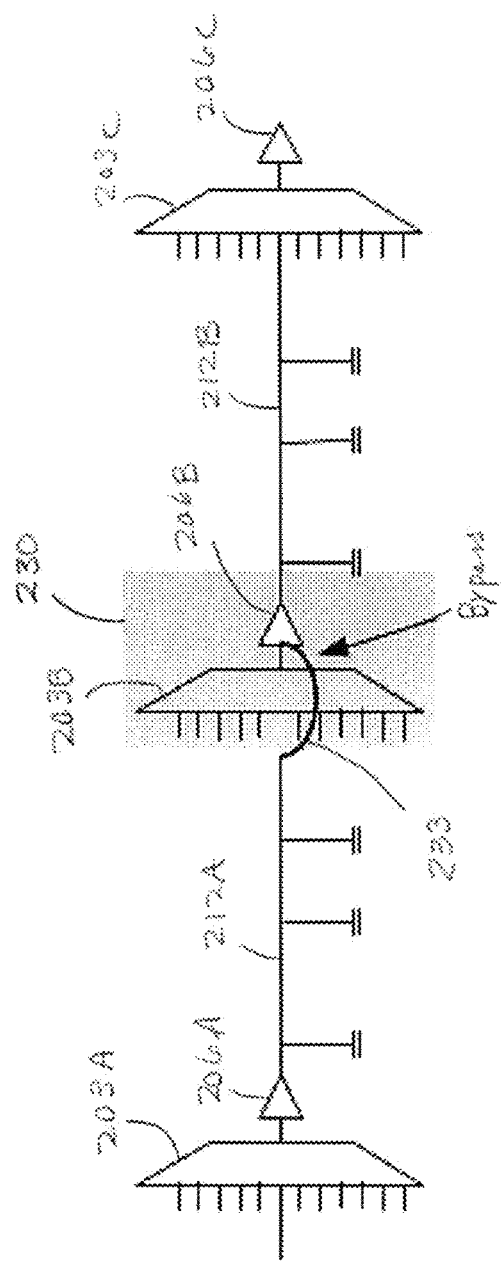

FIG. 8 shows another circuit arrangement for routing signals according to an exemplary embodiment. In this embodiment, highlighted area 230 denotes circuitry that is partially unpowered or powered down. More specifically, MUX 203B is unpowered, but buffer 206B is powered. To provide routing capability for the rest of the circuit (and/or for other circuitry in the FPGA), MUX 203B may be bypassed, for example, by using interconnect or coupling mechanism or link 233 (e.g., a metal trace). Thus, link 233 provides a routing mechanism for signals present at interconnect segment 212A (one input of MUX 203B) to reach and couple to interconnect segment 212B via buffer 206B. In effect, link 233 bypasses MUX 203B, but yet allows buffer 206B to buffer signals and thus reduce or avoid slower signal transitions mentioned above.

Figure 9:
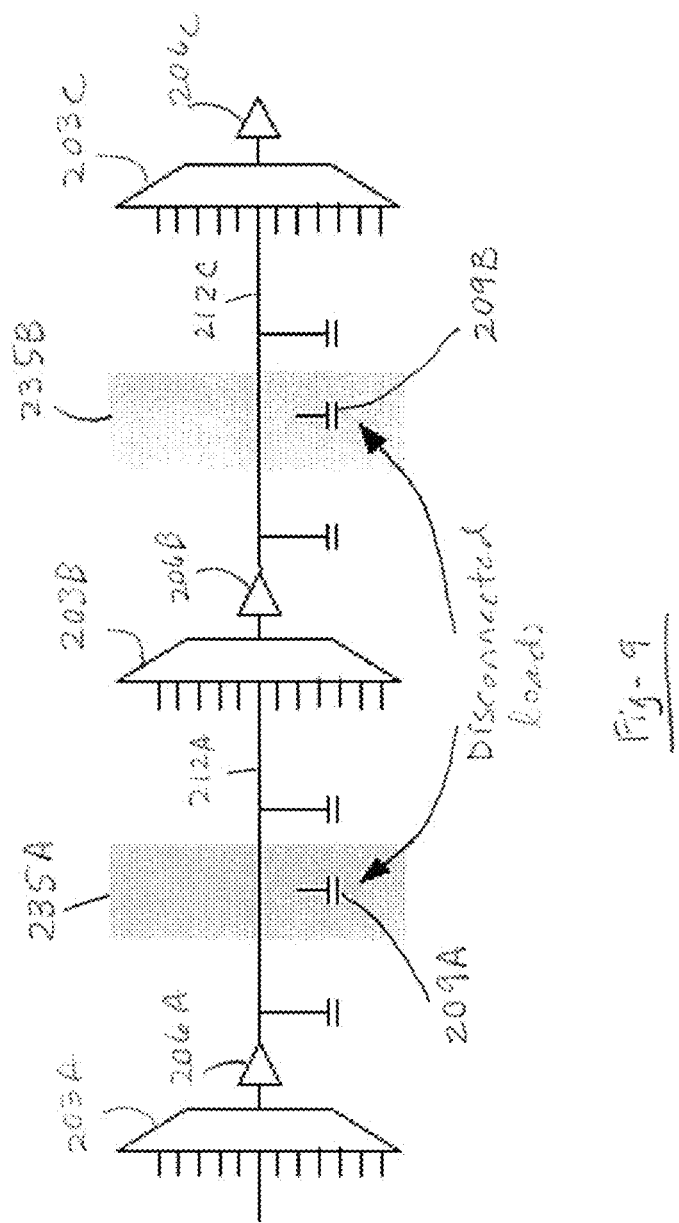

FIG. 9 shows another circuit arrangement for routing signals according to an exemplary embodiment. In this embodiment, highlighted areas 235A and 235B denote circuitry that is unpowered or powered down. Capacitive loads 209A-209B represent, respectively, loads presented to interconnect segments 212A-212B, respectively, by the unpowered or powered down circuitry. By uncoupling or disconnecting unpowered or powered down circuitry from interconnect segments 212A-212B (using properly configured mask layer(s)), one may improve performance and reduce power consumption, as described above.

Figure 10:
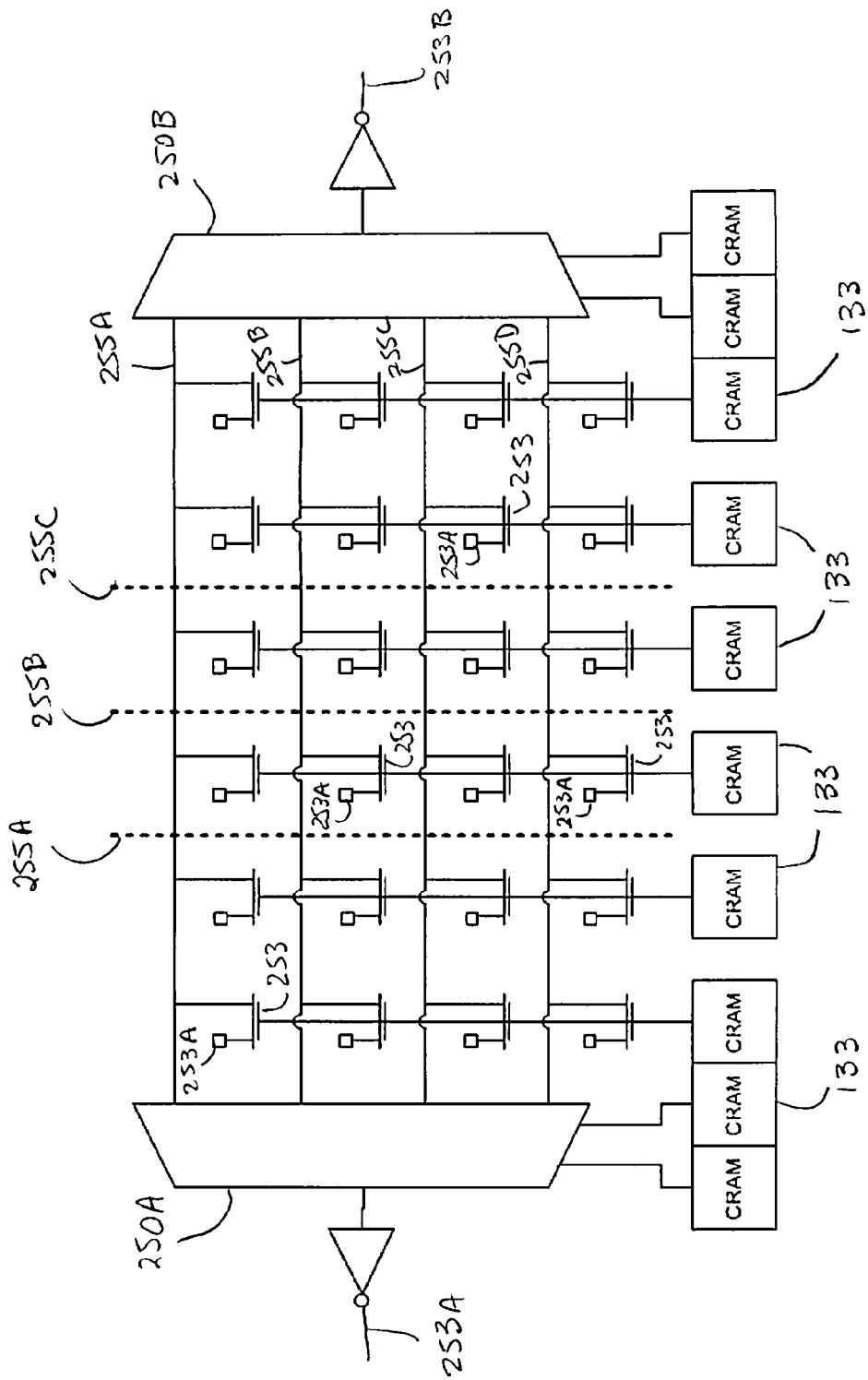
FIG. 10 depicts a circuit arrangement for configuring the characteristics of multiplexers according to an exemplary embodiment.

In some embodiments, mask layers may be used to configure the characteristics of MUXs within the FPGA, e.g., MUXs in programmable logic and/or programmable interconnect. FIG. 10 shows a circuit arrangement for using this technique according to an exemplary embodiment.

The embodiment in FIG. 10 shows a circuit that can route an arbitrary one of 24 signals (shown as inputs 253A to transistors 253) to one of two outputs 253A-253B via MUXs 250A-250B. More specifically, the circuit uses 24 transistors 253, arranged in a matrix that includes nets or interconnects or coupling mechanisms 255A-255D. CRAM cells 133 couple to, and control, transistors 253 and MUXs 250A-250B.

In effect, the circuit overall constitutes two MUXs for routing signals to outputs 253A-253B by configuring mask or interconnect layers. Specifically, dashed lines 255A-255B show locations where jumpers may be inserted (or not inserted) in nets 255A-255D. In other words, lines 255A-255B show locations where two segments of each of nets 255A-255B may be either electrically separated from each other (no jumper or link), or may be electrically coupled to each other (by using a jumper or link).

For example, consider the situation where nets 255A-255D are severed at the locations where the nets intersect line 255A (assume that lines 255B-255C are not used, and are omitted). By severing nets 255A-255D at those locations (i.e., no jumpers), one obtains two MUXs, one with 8 inputs (to the left of line 255A), and another with 16 inputs (to the right of line 255A).

As another example, assume that nets 255A-255D are severed at the locations where the nets intersect line 255B (i.e., omit lines 255A and 255C). This configuration provides two MUXs, one to the right of line 255B and one to the left of line 255B, with each MUX having 12 inputs. As another example, one may sever nets 255A-255D at the locations where the nets intersect line 255C (i.e., omit lines 255A-255B). This configuration results in two MUXs, one with 16 inputs (to the left of line 255C), and another with 8 inputs (to the right of line 255C). Thus, by configuring the interconnect layers (metal traces defined by the mask layers) in exemplary embodiments, one may produce MUXs with desired cardinalities, and therefore FPGA variants.

Even more fundamentally, in some embodiments, completely different interconnect or metal layers (including line widths, line spacings, etc.) may be used in different mask sets to produce differentiated FPGAs or FPGA variants. Conventional FPGAs typically have a specific interconnect plan, where different physical metal layers are allocated to serving as a particular type of interconnect. The width and the spacing of conductors of different types is determined to provide the desired levels of impedance, while fitting into the constraints of the metal stack.

Figure 11:
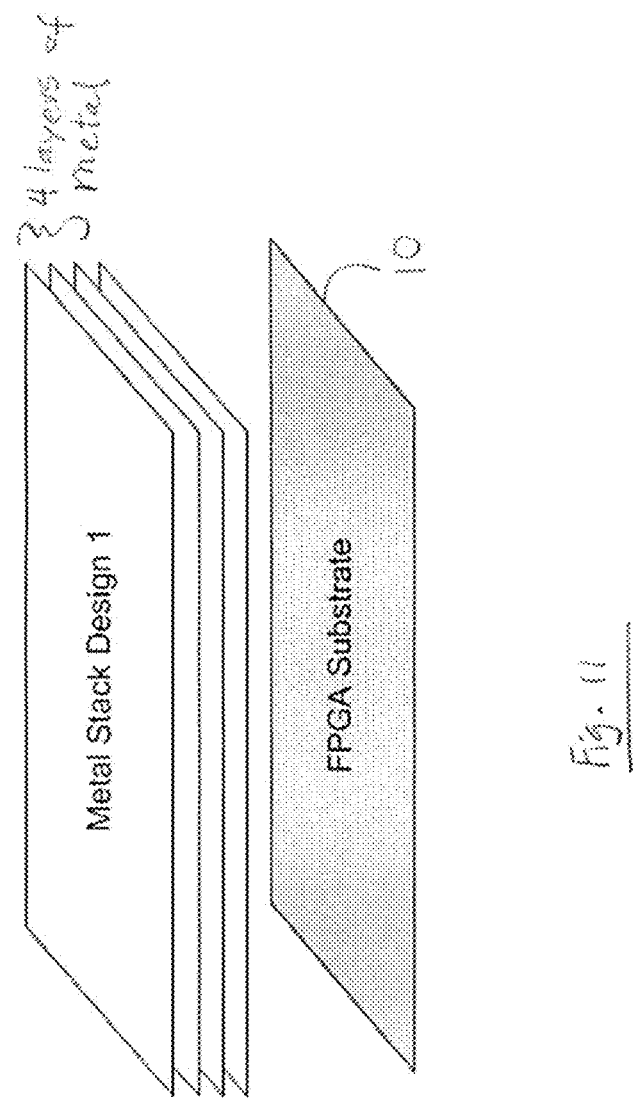
FIG. 11-12 show the use of different metal stack designs to produce FPGA variants according to exemplary embodiments.

In contrast to conventional FPGAs, in some embodiments, the metal stacks (set of interconnect or metal layers) may be altered, while maintaining compatibility with the FPGA substrate. FPGAs with fewer features and/or with lower cost may be fabricated by using metal stack designs that include fewer metal layers, with more densely packed and narrow conductors (which may result in relatively low performance, e.g., for a lower-cost market segment). FIG. 11 shows an example of such an FPGA according to an exemplary embodiment.

Figure 12:
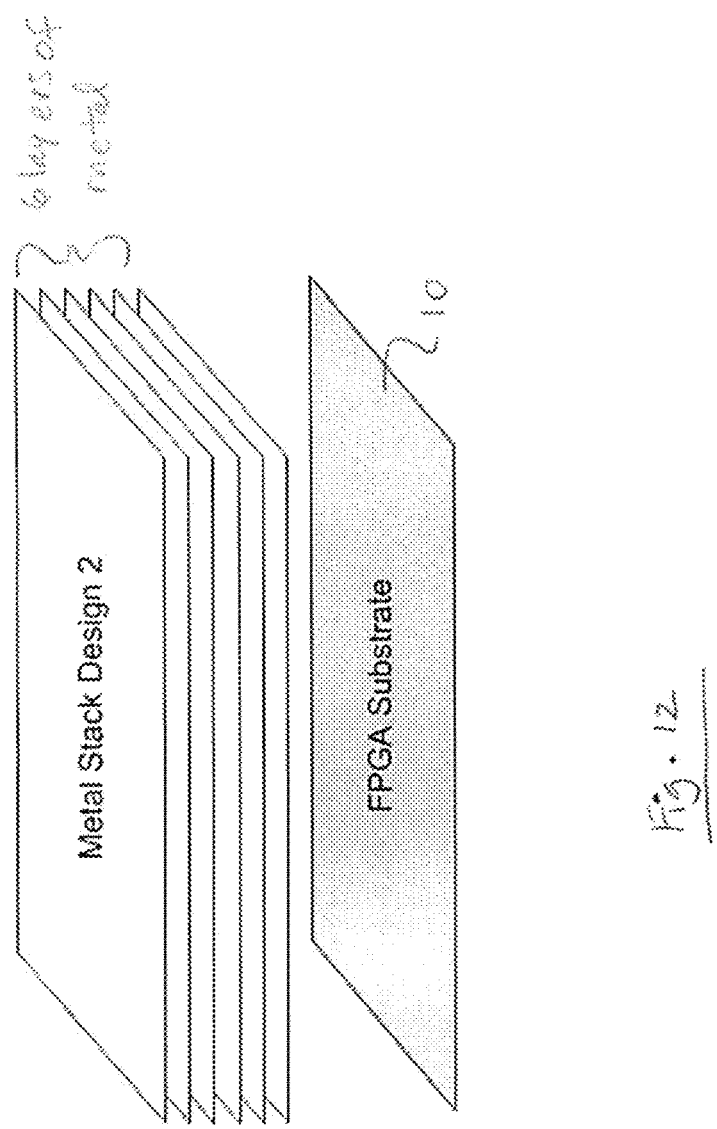

Conversely, metal stack designs with more metal layers and/or thicker conductor layers, could improve the FPGA's performance by increasing the spacing and/or width of conductors (albeit at a possibly increased product cost). FIG. 12 shows an example of such an FPGA according to an exemplary embodiment.

Figure 13:
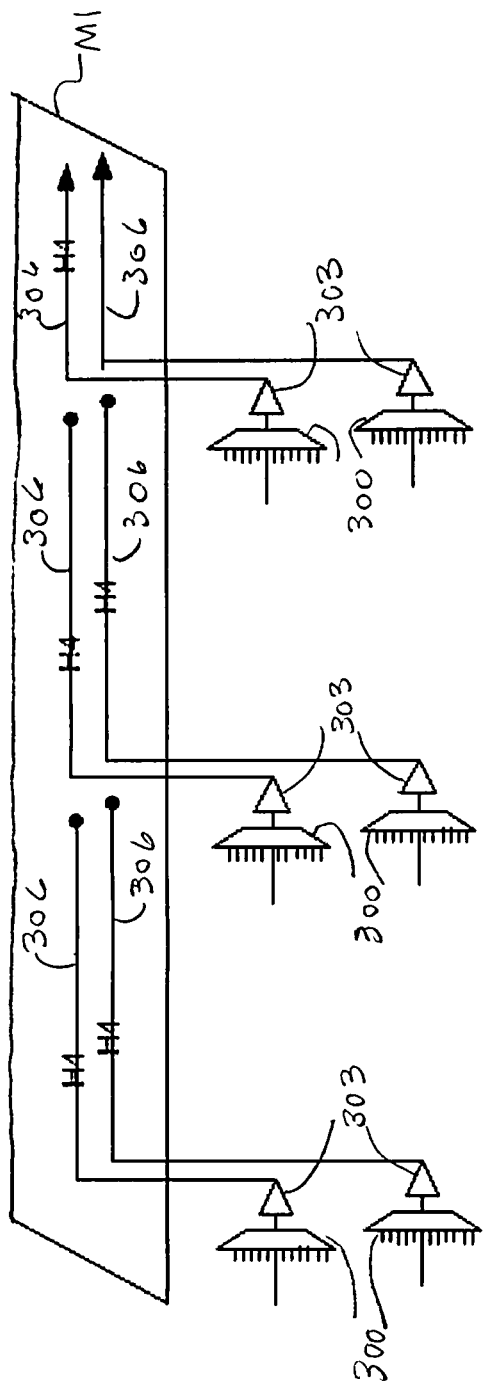
FIGS. 13-14 depict using different metal stack designs to produce FPGAs with differentiated interconnect circuitry.
Figure 14:
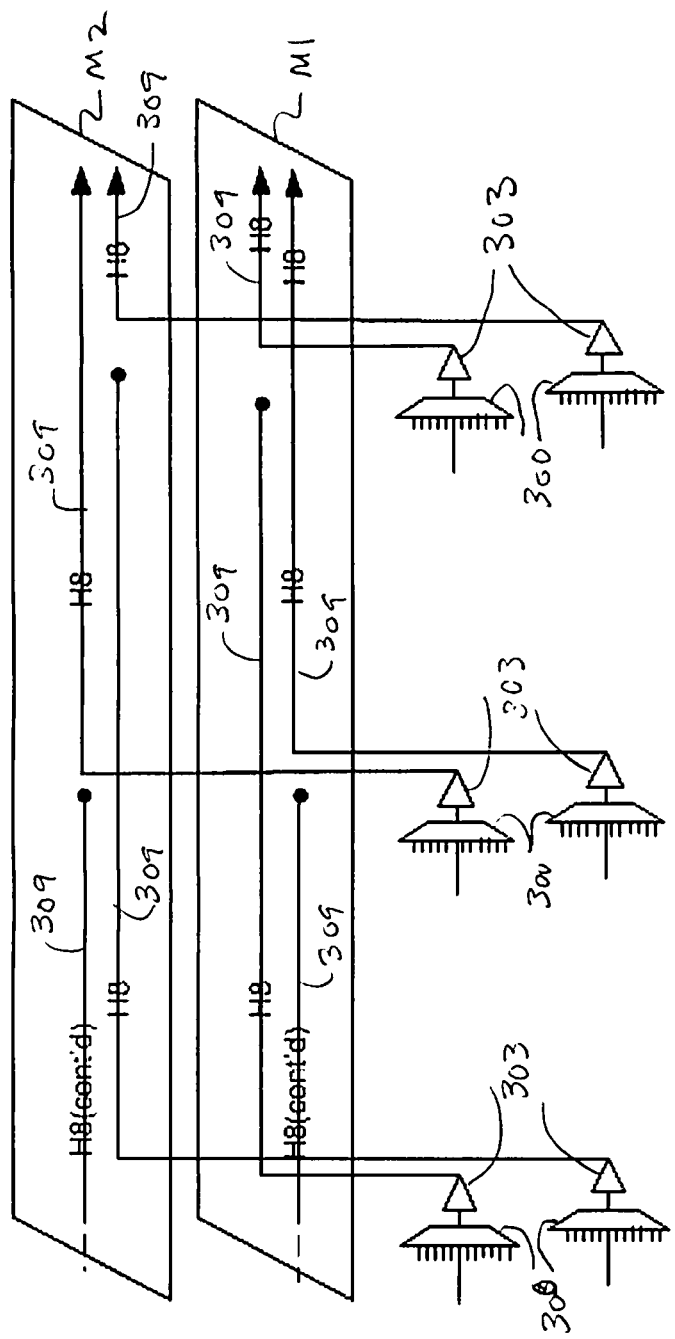

FIGS. 13-14 illustrate an example of using different metal stack designs. Referring to FIG. 13, MUXs 300 and buffers 303, grouped in pairs, drive interconnect segments 306 (labeled "H4") that each drive 4 blocks of programmable logic. The interconnect segments 306 are fabricated using a metal layer M1. In the configuration shown in FIG. 14, MUXs 300 and buffers 303, grouped in pairs, drive interconnect segments 309 (labeled "H8") that each drive or couple to 8 destinations, such as blocks of programmable logic or any other circuitry or block, for example, the blocks shown in FIG. 2. Referring to FIG. 14, because of the added number of driven blocks (8 in FIG. 14 versus 4 in FIG. 13), two metal layers, M1 and M2, are used in the embodiment in FIG. 14.

Note that the select inputs (not shown) of MUXs 300 in FIGS. 13-14 are typically driven by CRAM 133 (see FIG. 2). In other words, the contents of CRAM 133 cause particular inputs of MUXs 300 to be routed or coupled to the respective outputs of MUXs 300.

Many alternative embodiments are possible. For example, if the original H4 interconnect segments (see FIG. 13) are distributed across both metal layers M1-M2 (see FIG. 14), then the spacing between the interconnect segments could be increased. The increased spacing would reduce capacitance, cross-talk, and/or coupling between interconnect segments, and thus both reduce power consumption and improve performance (e.g., faster signal transitions).

Regardless of a particular configuration or implementation, the concepts shown in FIGS. 13-14 may be combined with one or more of the techniques described in this document (see, for example, FIGS. 5-12 and 15, and their corresponding descriptions) to produce FPGA architectural variations. Examples include powering down or unpowering blocks or circuits, etc.

Interconnect layer configuration can also be used to improve memory performance in FPGAs, such as memory 124 (see FIG. 2). Memories in modern FPGAs typically include a number of features, such as true dual port access and variable port width, that may limit performance for a specific user or application. For example, the timing for the memory access may be degraded to accommodate two different ports in different clock domains could be accessed at any time. If this feature is not desired or applicable in a particular application, market segment, etc. (i.e., if the user's design does not include simultaneous access to addresses in the same memory row), the memory's performance may be improved or accelerated. Conversely, the circuit implementation may have the worst-case timing circuitry hard-wired.

In this case, providing pre-planned bypasses of the self-timing circuitry could provide a mask-programmable approach to differentiating various FPGAs. For example, the FPGA with the high-performance memory may have limited features and the self-timing circuitry designed for the worst-case scenario of the limited feature-set. The FPGA variant with the full feature-set memory may have the slower timing circuitry.

The variability of different temperature and voltage corners or points can also sometimes limit the designer. Mask variants of memories could be accelerated if designed for a particular corner set, rather than the worst-case for all possible bins or temperatures/voltages.

A mask programmable refinement of the timing circuitry in the memory represents an additional way to mitigate product risk based on the variability of the semiconductor fabrication process. For example, in exemplary embodiments, parts of the timing circuitry (or other circuitry in the memory) may be unpowered or powered down and/or bypassed to produce the desired characteristics.

If at the time of the release of the design to manufacturing the fabrication process parameters are still not fully known or determined, the IC designer typically anticipates and plans for the worst case. If the capabilities of the actual fabrication technology exceeds the designer's worst-case assumptions, then the improved memory performance goes unused. If the design employed a mask programmable strategy, however, memory could be introduced with more aggressive or optimistic fabrication-process assumptions, with the contingency that if the manufactured FPGA does not meet specifications because of process or timing problems, a mask variant could be introduced to produce working parts, with relatively little additional cost.

In some embodiments, interconnect layer configuration can be used to improve I/O and interface circuit performance. In some embodiments, FPGA I/O circuits (see, for example, I/O circuitry 112 in FIG. 2) are designed to be programmable for a variety of voltages and electrical signaling standards. The combination of features sometimes results in sub-optimal performance or a loss of performance. For example, electrostatic discharge (ESD) specifications of one standard may result in using a large diode and resistor at FPGA pads, which add capacitance to the I/O pad's circuitry, and thus degrade or reduce performance. Other I/O standards, however, may not have the same ESD specifications. If the user does not use or need the more stringent I/O standard, an FPGA that meets the more stringent I/O standard would provide lower performance.

Similarly, some I/O standards have extensive voltage-support specifications. Consequently, if an FPGA is designed to meet a wide variety of voltage-support specifications, the specifications for a relatively small number of standards may add cost and complexity to the FPGA. To withstand higher voltages, designers use different transistor technologies (e.g., thicker oxide layers) or different circuit techniques, which tend to reduce performance and increase cost. If the voltage-support specifications and options can be anticipated (e.g., for a given end-use, market segment, etc.), the FPGA and the I/O circuitry may be designed such that one or more higher-level metal masks may be changed to modify the I/O circuitry (e.g., the topology of buffers) so that they can operate with lower voltages, resulting in improved performance.

Another area where interconnect layer configuration may be used is the layer between the I/O circuitry and the FPGA fabric, sometimes known as the interface layer. In conventional FPGAs, a full-featured FPGA supports multiple interface configurations by having the interfaces implemented in soft logic (programmable logic), with attendant higher costs, or having interfaces that are hardened but have been designed to support multiple protocols.

For example, a PCS layer near a serial transceiver I/O circuit may support a relatively large number of high-speed interfaces, such as Ethernet, Interlaken, PCI-express (the PCI-express media access control (MAC) layer may in addition support, say, Generations 1-3 of the PCIe specifications, with variable numbers of lanes for each specification), etc. Although flexible, the configurability tends to be costly.

By providing specialized or customized or optimized interfaces/interface layers by using configurable interconnect layers, power consumption may be reduced, and performance improved. In exemplary embodiments, mask layer configuration may be used to couple and/or power the interfaces that a targeted application domain actually will use.

Figure 15:
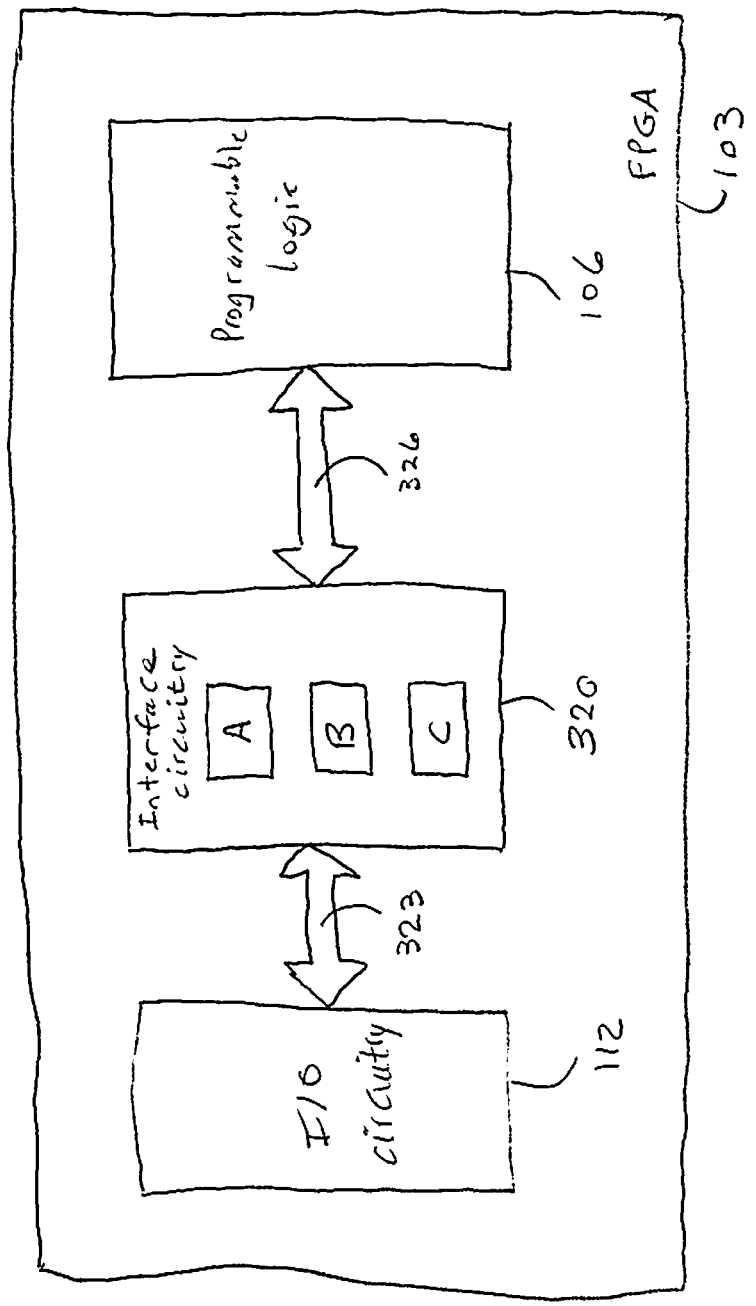
FIG. 15 illustrates application of interconnect layer configuration to interface circuitry in an FPGA according to an exemplary embodiment.

FIG. 15 illustrates an example of this technique. More specifically, FIG. 15 shows an FPGA 103 that includes interface circuitry 320, coupled to I/O circuitry 112 and to programmable logic 106 (generally the FPGA fabric) via links or interconnects 323 and 326, respectively. Interface circuitry 320 may include circuits (e.g., intellectual property or IP) that provide functionality, signaling, support, etc., for a variety of specifications or standards, as discussed above.

In the exemplary embodiment shown, interface circuitry 320 includes circuits or blocks of circuitry, labeled A, B, and C, respectively, to support three communication standards or specifications. By configuring interconnect layer(s) to unpower or power down and/or bypass one or more of the blocks of circuitry A-C, one may produce desired FPGA variants. As an example, suppose that in FPGA variant, the functionality provided by block A, but not blocks B and C, is desired. In this scenario, one or more interconnect or mask layers may be configured so as to power and couple block A to I/O circuitry 112 and programmable logic 106, but to unpower and/or bypass blocks B-C in interface circuitry 320. Other variations are possible, depending on the desired protocols, standards, or specifications that one wishes to support in a given FPGA variant.

Interconnect layer configuration may also be used to coordinate development of FPGA hardware and features with computer-aided design (CAD) flow software. For a user to be able to use a feature available in the FPGA's hardware, software has to support that feature. Otherwise, the feature, while present, remains unused, and may increase power consumption and adversely impact performance.

Configuration of interconnect layers provides an alternative, where a feature may be unpowered or powered down and/or bypassed. Similarly, the CRAM cells and other circuitry (e.g., transistors) used to support the feature are present, but may be unpowered or powered down and bypassed to have as small an impact on the current user designs as possible. FPGA variants with modified mask layers that enable various features may then be used in coordination with CAD software releases that support the enabled features.

Conversely, this mechanism allows for retraction of a costly architectural feature. For example, suppose a manufacturer introduces a change to an FPGA architecture to introduce a feature that might be anticipated as desirable, but that is untested in the market and by users of the FPGA. In that case, interconnect configuration may be used in the first or early FPGA designs to include that feature, but also include mechanisms for an anticipated bypass of the feature. If the feature turns out not to be desirable (not used, costly, unsuitable to the market segment, etc.), the feature may be bypassed with relatively low cost. This technique may also be used to initially remove an architectural feature by bypassing the circuitry existing in the FPGA substrate. If the feature later is deemed desirable, an interconnect configuration may be used to produce an FPGA variant that includes or re-introduces the feature.

Examples described in this document refer to FPGAs, and constitute merely illustrative applications or embodiments. They are not intended to limit the application of the disclosed concepts to other types of device or circuit, such as programmable logic device (PLD), complex PLD (CPLD), etc., by making appropriate modifications.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An integrated circuit (IC), comprising:
a substrate, the substrate being common to the IC and variants of the IC;
a first set of interconnect layers fabricated above the substrate and used to couple programmable interconnect of the IC to a first circuit in the substrate; and
a second set of interconnect layers fabricated above the substrate, the second set of interconnect layers used to differentiate features of the IC from variants of the IC by selectively coupling the programmable interconnect to a second circuit in the substrate.

2. The IC according to claim 1, wherein the second circuit is selectively coupled to match features of the IC to a desired application.

3. The IC according to claim 1, wherein the second circuit is selectively coupled to provide support for an input/output (I/O) standard.

4. The IC according to claim 1, wherein the second circuit is unused in a design implemented using resources of the IC.

5. The IC according to claim 4, wherein the second circuit is selectively coupled such that the circuit is unpowered and/or bypassed.

6. The IC according to claim 5, wherein the second circuit comprises a multiplexer, an I/O circuit, an arithmetic circuit, or a memory timing circuit.

7. The IC according to claim 1, wherein the second circuit is selectively coupled to provide specified features for a memory circuit included in the IC.

8. The IC according to claim 1, wherein the first and second sets of interconnect layers comprise, respectively, first and second sets of traces, and wherein the second set of traces are wider than the first set of traces order to improve signal communication in the IC.

9. A field programmable gate array (FPGA), comprising:
a substrate that includes FPGA fabric to implement a user's design, the FPGA fabric including programmable resources for providing a set of features;
a first set of metal layers to couple to one another circuitry in the substrate of the FPGA; and
a second set of metal layers to modify the set of features by unpowering and/or bypassing a resource corresponding to a feature in the set of features.

10. The FPGA according to claim 9, wherein the programmable resources of the FPGA fabric comprise a plurality of blocks of programmable logic.

11. The FPGA according to claim 10, wherein the resource comprises an arithmetic circuit or a multiplexer in a block of programmable logic in the plurality of blocks of programmable logic.

12. The FPGA according to claim 9, wherein the resource comprises at least one of a multiplexer and a buffer used in a programmable interconnect of the FPGA.

13. The FPGA according to claim 9, wherein the resources comprises a circuit unused in implementing the user's design.

14. The FPGA according to claim 13, wherein the resource further comprises configuration memory cells corresponding to the circuit unused in implementing the user's design.

15. A method of fabricating field programmable gate arrays (FPGAs), the method comprising:
fabricating a first substrate to produce a first FPGA, and fabricating a second substrate to produce a second FPGA, the first and second substrates including the same circuitry;
fabricating a first set of interconnect layers above the first substrate to interconnect circuitry in the first substrate, and fabricating a second set of interconnect layers above the second substrate to interconnect circuitry in the second substrate, the first and second sets of interconnect layers having the same topology;
fabricating a third set of interconnect layers above the first substrate to configure features of the first FPGA, and fabricating a fourth set of interconnect layers above the second substrate to configure features of the second FPGA, the third and fourth sets of interconnect layers having different topologies.

16. The method according to claim 15, wherein the third set of interconnect layers is fabricated to unpower and/or bypass a first circuit in the first substrate.

17. The method according to claim 16, wherein the fourth set of interconnect layers is fabricated to unpower and/or bypass a second circuit in the second substrate.

18. The method according to claim 17, wherein one of the first and second circuits comprises a routing multiplexer and/or a buffer.

19. The method according to claim 17, wherein one of the first and second circuits comprises a multiplexer and/or an arithmetic circuit used in a programmable logic circuit.

20. The method according to claim 15, wherein the third set of interconnect layers is fabricated to unpower a first circuit in the first substrate, and wherein the fourth set of interconnect layers is fabricated to route power to a second circuit in the second substrate, the second circuit being a counterpart of the first circuit.

* * * * *